United States Patent
Park et al.

(10) Patent No.: US 8,476,108 B2
(45) Date of Patent: Jul. 2, 2013

(54) METHOD AND APPARATUS FOR MANUFACTURING SEMICONDUCTOR DEVICE

(75) Inventors: Sang Ki Park, Gyeonggi-do (KR); Seong Ryong Hwang, Seoul (KR); Geun Tae Cho, Seoul (KR)

(73) Assignee: Jusung Engineering Co., Ltd (KR)

( * ) Notice: Subject to any disclaimer, the term of this patent is extended or adjusted under 35 U.S.C. 154(b) by 0 days.

(21) Appl. No.: 13/343,248

(22) Filed: Jan. 4, 2012

(65) Prior Publication Data

US 2012/0100710 A1 Apr. 26, 2012

Related U.S. Application Data

(62) Division of application No. 12/635,672, filed on Dec. 10, 2009, now Pat. No. 8,110,435.

(30) Foreign Application Priority Data

Dec. 18, 2008 (KR) .................. 10-2008-0129158
Nov. 10, 2009 (KR) .................. 10-2009-0108069

(51) Int. Cl.
*H01L 21/00* (2006.01)
*H01L 21/16* (2006.01)
*H01L 21/31* (2006.01)
*H01L 21/469* (2006.01)

(52) U.S. Cl.
USPC .......... 438/104; 438/758; 438/785; 438/778; 438/787

(58) Field of Classification Search
USPC .............. 438/104, 478, 509, 592, 685, 795, 438/689, 694, 785, 758, 778, 763, 476, 761, 438/787, 728, 729, 775
See application file for complete search history.

(56) References Cited

U.S. PATENT DOCUMENTS

| | | | | |
|---|---|---|---|---|
| 5,994,156 A | * | 11/1999 | Voutsas et al. | 438/30 |
| 6,549,392 B1 | * | 4/2003 | Ohno et al. | 361/234 |
| 2007/0020903 A1 | * | 1/2007 | Takehara et al. | 438/592 |
| 2007/0254113 A1 | | 11/2007 | Hongo et al. | |
| 2010/0040859 A1 | * | 2/2010 | Chang et al. | 428/304.4 |

* cited by examiner

Primary Examiner — Chuong A. Luu (57) ABSTRACT

A method and apparatus for manufacturing a semiconductor device is disclosed, which is capable of realizing an extension of a cleaning cycle for a processing chamber, the method comprising preheating a substrate; placing the preheated substrate onto a substrate-supporting unit provided in a susceptor while the preheated substrate is maintained at a predetermined height from an upper surface of the susceptor provided in a processing chamber; and forming a thin film on the preheated substrate, wherein a temperature of the preheated substrate is higher than a processing temperature for forming the thin film in the processing chamber.

20 Claims, 8 Drawing Sheets

□ BEFORE CLEANING PROCESS
○ AFTER CLEANING PROCESS

METHOD AND APPARATUS FOR MANUFACTURING SEMICONDUCTOR DEVICE

CROSS REFERENCE TO RELATED APPLICATIONS

This application is a Divisional Application of the U.S. application Ser. No. 12/635,672, filed Dec. 10, 2009 now U.S. Pat. No. 8,110,435, which claims the benefit of the Korean Patent Application Nos. P2008-0129158 filed on Dec. 18, 2008, and P2009-0108069 filed on Nov. 10, 2009, which are hereby incorporated by reference as if fully set forth herein.

BACKGROUND OF THE INVENTION

1. Field of the Invention

The present invention relates to a method and apparatus for manufacturing a semiconductor device, and more particularly, to a method and apparatus for manufacturing a semiconductor device, which is capable of realizing an extension of a cleaning cycle for a processing chamber.

2. Discussion of the Related Art

Generally, a semiconductor device, a solar cell, a liquid crystal display device, and a light-emitting display device are manufactured by semiconductor-manufacturing steps including a thin-film deposition process, a photo process, an etching process, and a diffusion process.

The thin-film deposition process may use a physical vapor deposition (PVD) or chemical vapor deposition (CVD) method. Recently, the CVD method is mainly used owing its advantageous deposition characteristic of great step coverage of thin film, high uniformity, and good yield.

In case of the CVD method, a gaseous ingredient material is firstly supplied to a processing chamber, and then a desired thin film is deposited on a substrate (or wafer) by a chemical reaction. The CVD method may be largely classified into a low pressure chemical vapor deposition (LPCVD), an atmospheric pressure chemical vapor deposition (APCVD), a low temperature chemical vapor deposition (LTCVD), a plasma enhanced chemical vapor deposition (PECVD), and a metal organic chemical vapor deposition (MOCVD). For example, the MOCVD uses a pyrolysis reaction so as to deposit a thin film on a substrate.

A processing chamber for the thin-film deposition process using the CVD method is provided with a susceptor for supporting the substrate; and a heater for heating the substrate is provided in the susceptor so as to accelerate the thin-film deposition process. In order to raise a temperature of the substrate to a processing temperature, the heater heats the susceptor to a predetermined temperature which is higher than the temperature of the substrate.

In the processing chamber with the aforementioned structure, the susceptor is firstly heated by the heater, and the substrate is secondly heated to the processing temperature through the heat of the susceptor, whereby the corresponding thin-film deposition process is carried out to form the desired thin film on the substrate.

When carrying out the thin-film deposition process using the CVD method according to the related art, a thin-film material to be deposited on the substrate by the heat of the susceptor or a power generated by pyrolysis reaction of the ingredient gas may be deposited on undesired portions as well as a targeted portion such as the substrate, wherein the undesired portions correspond to inside walls of the processing chamber, and upper and/or lateral surfaces of the susceptor except other portions occupied by the substrate.

Accordingly, it is necessary to cyclically clean the inside of the processing chamber. In recent, a dry cleaning method using a cleaning gas has been used widely. However, since the inside of the processing chamber can not be cleaned only with the dry cleaning method, a wet cleaning method has to be additionally used to perfectly clean the inside of the processing chamber after disjointing the processing chamber by a worker.

However, if cleaning the inside of the processing chamber by the wet cleaning method, the apparatus including the processing chamber to be cleaned has to be turned off. In addition, after completing the wet cleaning method, a pumping step has to be applied so as to remove moistures and impurities generated for the cleaning process from the processing chamber, and then a stabilizing step for providing a stable processing temperature and temperature has to be applied to the processing chamber. Furthermore, a step for checking a uniformity of thin film and a pollution level of particles has to be inevitably made by applying a virtual deposition process to a dummy substrate, which causes the waste of time and low yield. Accordingly, there is a need for methods and apparatus which are capable of extending a wet-cleaning cycle.

SUMMARY OF THE INVENTION

Accordingly, the present invention is directed to a method and apparatus for manufacturing a semiconductor device that substantially obviates one or more problems due to limitations and disadvantages of the related art.

An object of the present invention is to provide a method and apparatus for manufacturing a semiconductor device, which is capable of realizing an extension of a cleaning cycle for a processing chamber.

Another object of the present invention is to provide a method and apparatus for manufacturing a semiconductor device, which is capable of realizing an extension of a cleaning cycle for a processing chamber, and improving an interfacial property of a thin film formed on a substrate.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method for manufacturing a semiconductor device comprising preheating a substrate; placing the preheated substrate onto a substrate-supporting unit provided in a susceptor while the preheated substrate is maintained at a predetermined height from an upper surface of the susceptor provided in a processing chamber; and forming a thin film on the preheated substrate, wherein a temperature of the preheated substrate is higher than a processing temperature for forming the thin film in the processing chamber.

In another aspect of the present invention, a method for manufacturing a semiconductor device comprises preheating a substrate; placing the preheated substrate onto a substrate-supporting unit provided in a susceptor while the preheated substrate is maintained at a predetermined height from an upper surface of the susceptor provided in a processing chamber; and forming a thin film on the preheated substrate, wherein the inside of the processing chamber is maintained at a predetermined temperature which is lower than a temperature of the preheated substrate.

In another aspect of the present invention, an apparatus for manufacturing a semiconductor device comprises a processing chamber for a thin-film forming process; a preheating chamber for preheating a substrate so that a temperature of the preheated substrate is higher than a processing temperature for the thin-film forming process in the processing chamber; and a substrate-transferring unit for transferring the preheated substrate to the processing chamber, wherein the processing chamber comprises a susceptor; and a substrate-supporting unit, provided at a predetermined height from the susceptor, for supporting the preheated substrate transferred by the substrate-transferring unit while the preheated substrate is maintained at the predetermined height from an upper surface of the susceptor.

In another aspect of the present invention, an apparatus for manufacturing a semiconductor device comprises a preheating chamber for preheating a substrate; a substrate-transferring unit for transferring the preheated substrate to a processing chamber; and a processing chamber, which is maintained to be lower than a temperature of the preheated substrate, for forming a thin film on the preheated substrate transferred by the substrate-transferring unit, wherein the processing chamber comprises a susceptor; and a substrate-supporting unit, provided at a predetermined height from the susceptor, for supporting the preheated substrate transferred by the substrate-transferring unit while the preheated substrate is maintained at the predetermined height from an upper surface of the susceptor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a method and apparatus for manufacturing a semiconductor device according to the present invention will be described with reference to the accompanying drawings.

Figure 1:
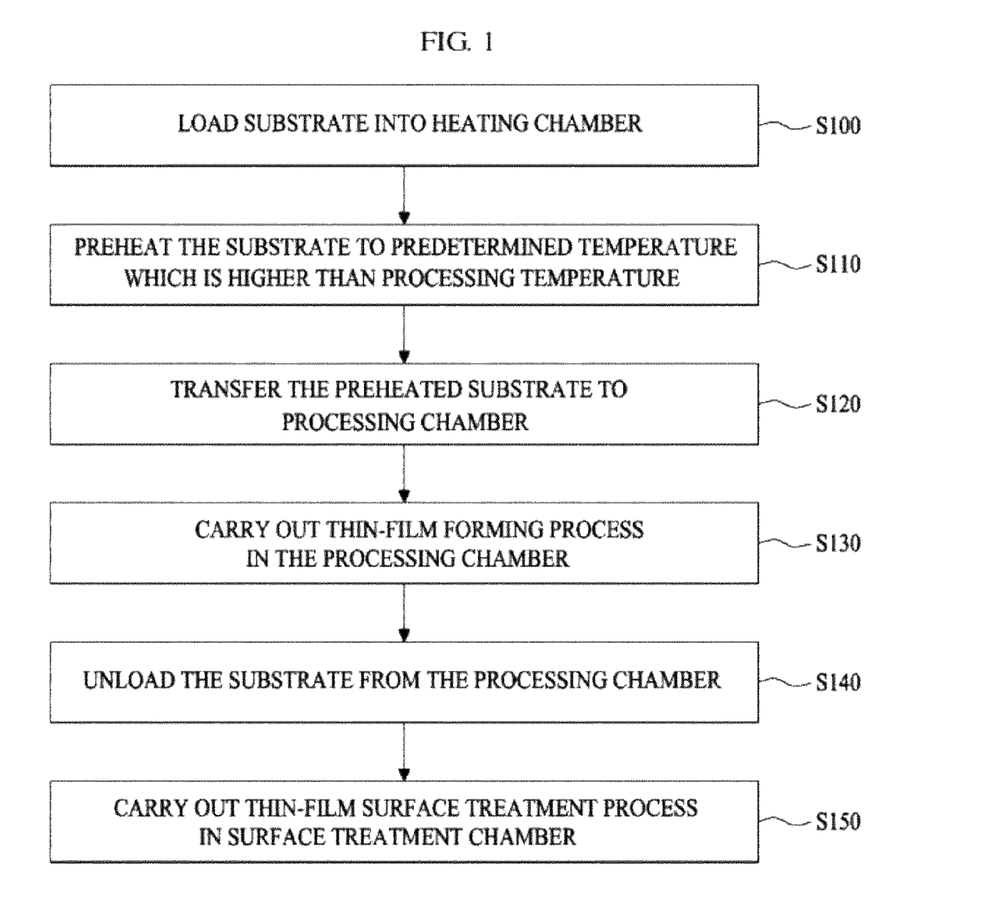
FIG. 1 is a flowchart illustrating a method for manufacturing a semiconductor device according to the embodiment of the present invention.

FIG. 1 is a flowchart illustrating a method for manufacturing a semiconductor device according to the embodiment of the present invention.

A method for manufacturing a semiconductor device according to the embodiment of the present invention will be described with reference to FIG. 1.

First, a substrate is loaded into a preheating chamber (S100). The substrate may be a glass substrate used for manufacturing a flat display device or a solar cell; or may be a semiconductor wafer used for manufacturing a semiconductor device.

Then, the substrate loaded into the preheating chamber is preheated to a predetermined temperature which has to be higher than a temperature of a thin-film deposition process (S110). In this case, the preheating temperature of the substrate is determined in consideration to the cooling margin of substrate-transferring process, and processing time and temperature in a processing chamber. For example, if the processing temperature is at 100~400° C., the preheating temperature of the substrate may be 20% higher than the processing temperature.

The preheated substrate is transferred to the processing chamber, and is then placed onto a susceptor of the processing chamber (S120). In this case, an inner temperature of the processing chamber may be set within a range between an atmospheric temperature and the preheating temperature of the substrate.

The preheated substrate may be placed onto an upper surface of the susceptor; or the preheated substrate may be provided at a predetermined height from the upper surface of the susceptor while being supported by a substrate-supporting unit provided in the susceptor.

When the preheated substrate is placed onto the upper surface of the susceptor in the processing chamber, the thin-film deposition process using PECVD (Plasma Enhanced Chemical Vapor Deposition) or MOCVD (Metal Organic Chemical Vapor Deposition) may be carried out so as that a desired thin film is deposited on the preheated substrate (S130). According as the preheated substrate is slowly cooled in the processing chamber, the thin-film deposition process proceeds. At this time, the preheated substrate is slowly cooled to 100~400° C. by the inner temperature of the processing chamber, whereby the desired thin film is deposited on the substrate without additionally heating the substrate by a heating apparatus provided in the susceptor. For the aforementioned thin-film deposition process, a thin film of zinc oxide (ZnO) is deposited on the preheated substrate, but it is not limited to this. The aforementioned thin-film deposition process may be any process for forming the desired thin film on the substrate in methods for manufacturing the semiconductor device, solar cell, liquid crystal display device, light-emitting display device, and etc.

When the aforementioned thin-film deposition process is completed, the substrate with the thin film deposited thereon is unloaded from the processing chamber to the external (S140).

The method for manufacturing the semiconductor device according to the embodiment of the present invention may include an additional thin-film surface treatment process for improving an interfacial property of the thin film deposited on the substrate (S150).

After the substrate unloaded from the processing chamber is loaded into a surface treatment processing chamber, the surface of the thin film deposited on the substrate is treated by a plasma or annealing process using argon (Ar) or hydrogen ($H_2$) gas, to thereby lower a root-mean-square (Rms) value of the thin film deposited on the substrate, and improve electron mobility in the thin film deposited on the substrate. In this case, particle or thin film unnecessarily deposited on the inner surface of the processing chamber except the substrate for the aforementioned thin-film deposition process may be removed by the aforementioned thin-film surface treatment process. The aforementioned thin-film surface treatment process may be omissible.

Figure 2A:
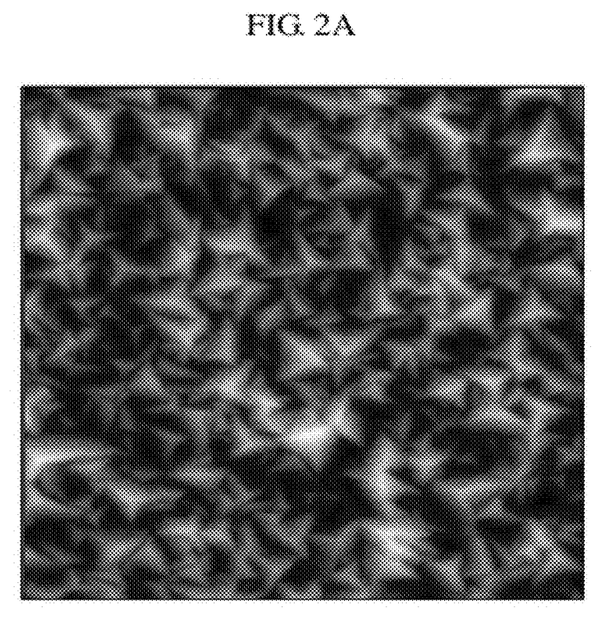
FIGS. 2A and 2B illustrate a thin film formed on a substrate before/after a surface treatment process explained in FIG. 1.
Figure 2B:
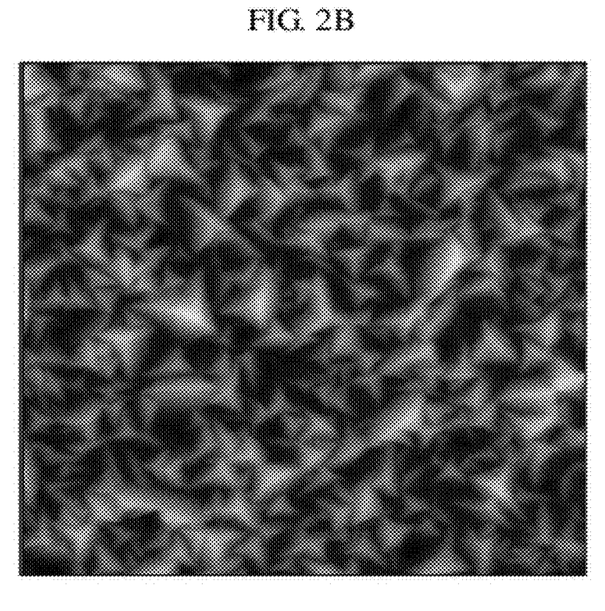

For example, as shown in FIG. 2A, if the aforementioned thin-film surface treatment process is carried out after forming the thin film of zinc oxide (ZnO) by the thin-film deposition process, the thin film of ZnO formed on the substrate has such a structure shown in FIG. 2B to improve the interfacial property.

When comparing the Rms value before the thin-film surface treatment process with the Rms value after the thin-film surface treatment process from AFM data of the thin film formed on the substrate, the Rms value before the thin-film surface treatment process is 51.786 nm, and the Rms value after the thin-film surface treatment process is 48.664 nm. Accordingly, the aforementioned thin-film surface treatment process enables improvement of the interfacial property in the thin film formed on the substrate, whereby the Rms value is lowered as shown above.

Figure 3:
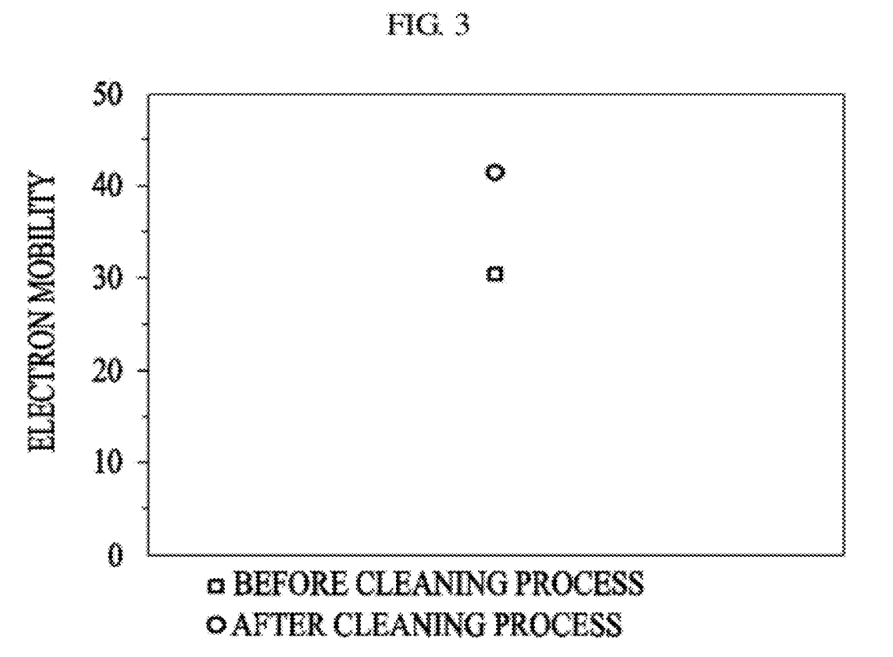
FIG. 3 illustrates an electron mobility in a thin film formed on a substrate before/after a surface treatment process explained in FIG. 1.

When comparing the electron mobility before the thin-film surface treatment process with the electron mobility after the thin-film surface treatment process by using a hall measurement method of the thin film formed on the substrate, as shown in FIG. 3, the electron mobility before the thin-film surface treatment process is 30.47 $cm^2$/V·sec, and the electron mobility after the thin-film surface treatment process is 41.50 $cm^2$/V·sec. Accordingly, the aforementioned thin-film surface treatment process enables improvement of the electron mobility in the thin film formed on the substrate.

Figure 4:
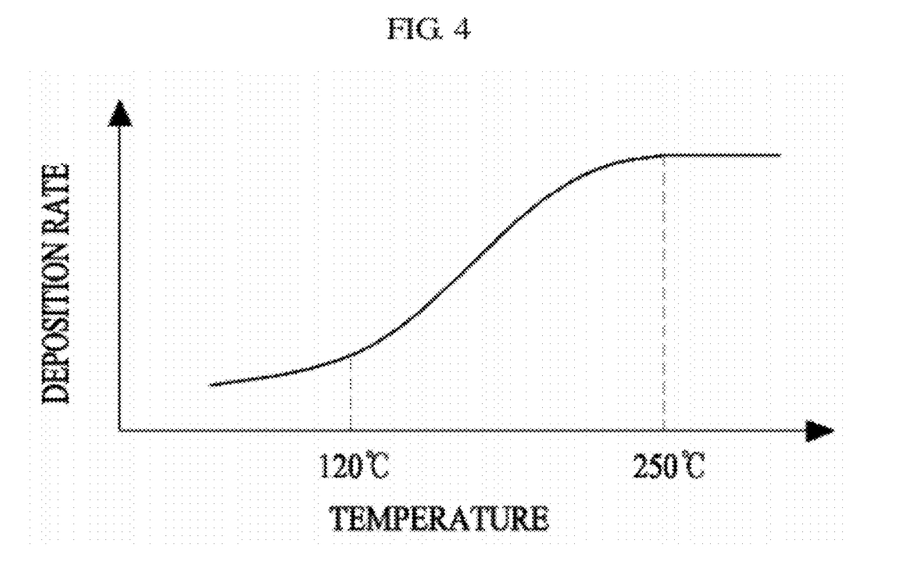
FIG. 4 is a graph explaining a deposition rate of a thin film according to a temperature of a processing chamber.

In the method for manufacturing the semiconductor device according to the embodiment of the present invention, the substrate is preheated to the predetermined temperature to be higher than the processing temperature while the substrate is positioned outside the processing chamber; the preheated substrate is transferred to the processing chamber; and then the thin-film deposition process is applied to the preheated substrate. Thus, a cleaning cycle for the processing chamber is extended in a wet or dry cleaning method by minimizing the contamination inside the processing chamber, that is, inner sidewalls of the processing chamber, and upper and/or lateral surfaces of the susceptor except other portions occupied by the substrate. For example, when the temperature of the processing chamber is at 120~250° C., a deposition rate of the thin film on the inner surfaces of the processing chamber except the substrate for the thin-film deposition process is largely increased as shown in FIG. 4. According to the present invention, when the thin-film deposition process is applied to the preheated substrate without additionally heating the substrate under such circumstances that the inner temperature of the processing chamber is constantly maintained at 120° C. or less, the desired thin film is deposited on the substrate, and the cleaning period for the processing chamber can be extended owing to the minimized thin-film deposition rate on the inner surfaces of the processing chamber.

Figure 5:
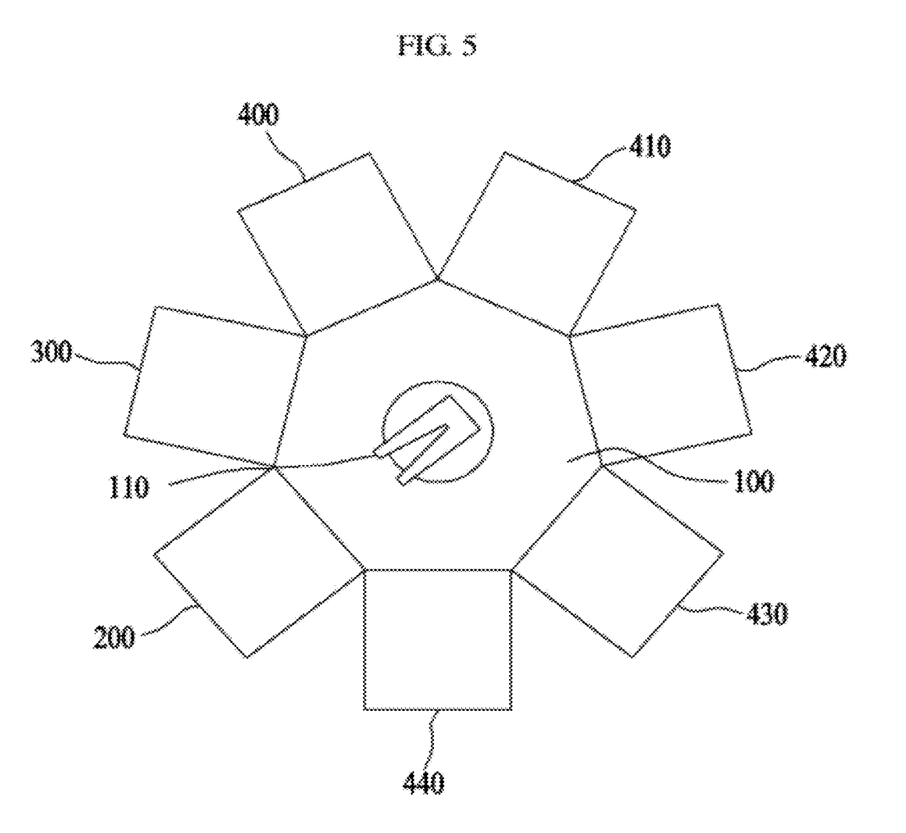
FIG. 5 illustrates an apparatus for manufacturing a semiconductor device according to the first embodiment of the present invention.

FIG. 5 illustrates an apparatus for manufacturing a semiconductor device according to the first embodiment of the present invention.

Referring to FIG. 5, the apparatus for manufacturing the semiconductor device according to the first embodiment of the present invention has a cluster-type arrangement structure, which comprises a substrate-transferring chamber 100, a load-lock chamber 200, a preheating chamber 300, and a plurality of processing chambers 400, 410, 420, 430, and 440.

The substrate-transferring chamber 100 is positioned at the central part surrounded by the respective chambers, wherein the substrate-transferring chamber 100 transfers the substrate to the respective chambers. For this, the substrate-transferring chamber 100 includes a substrate-transferring unit 110 for transferring the substrate to the respective chambers. The substrate-transferring chamber 100 is surrounded by the load-lock chamber 200, the preheating chamber 300, and the plurality of processing chambers 400, 410, 420, 430, and 440.

The load-lock chamber 200 includes at least one substrate-storing slot (not shown) for temporarily storing the substrate supplied from the external therein; a substrate-supporting unit (not shown) for preventing the substrate from being in direct contact with each substrate-storing slot; and a door (not shown) for loading and unloading the substrate therethrough.

The preheating chamber 300 is provided to preheat the substrate transferred by the substrate-transferring unit 110 so that the temperature of the substrate becomes higher than the temperature of the thin-film deposition process. In this case, the preheating temperature of the substrate is determined in consideration to the cooling margin of the substrate-transferring process from the preheating chamber 300 to the processing chambers 400, 410, 420, 430, and 440 by the substrate-transferring unit 110; and the processing time and temperature in the processing chambers 400, 410, 420, 430, and 440. For example, if the processing temperature is at 100~400° C., the preheating chamber 300 may be set in such a way that the preheating temperature of the substrate may be 20% higher than the processing temperature. The preheating chamber 300 may preheat the substrate to the predetermined temperature through the use of heating apparatus such as coil heater or lamp heater.

The load-lock chamber 200 and the preheating chamber 300 may be deposited in sequence. That is, the preheating chamber 300 may be arranged on the load-lock chamber 200.

Each of the processing chambers 400, 410, 420, 430, and 440 receives the substrate preheated by the preheating chamber 300 and transferred by the substrate-transferring unit 110; and applies the thin-film deposition process using the CVD method to the preheated substrate. According as the preheated substrate is slowly cooled in each of the processing chambers 400, 410, 420, 430, and 440, the thin-film deposition process proceeds. In this case, the preheated substrate is slowly cooled to 100~400° C. by the constantly-maintained temperature inside the processing chamber. Even though the substrate is not heated for the thin-film deposition process through the use of additional heating apparatus, the desired thin film can be deposited on the substrate. For the aforementioned thin-film deposition process, a thin film of zinc oxide (ZnO) is deposited on the preheated substrate, but it is not limited to this. The aforementioned thin-film deposition process may be any process for forming the desired thin film on the substrate in methods for manufacturing the semiconductor device, solar cell, liquid crystal display device, light-emitting display device, and etc.

Figure 6:
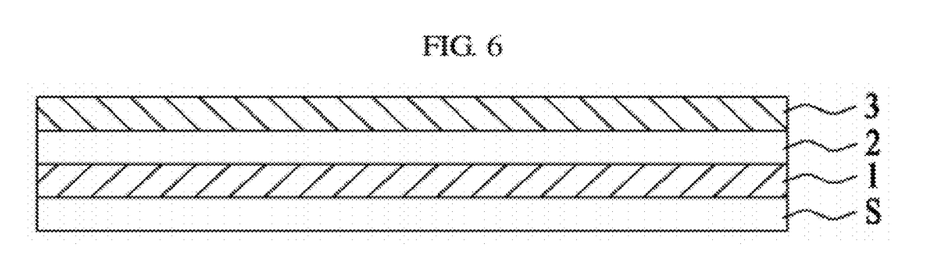
FIG. 6 illustrates a solar cell manufactured by the apparatus shown in FIG. 5.

For example, as shown in FIG. 6, if manufacturing the solar cell comprising a front electrode 1, a semiconductor layer 2, and a rear electrode 3 on the preheated substrate (S), the apparatus for manufacturing the semiconductor device according to the present invention may comprise the preheating chamber 400 for forming the front electrode 1 of a transparent material such as ZnO on the preheated substrate (S); the processing chamber 410 for forming a P-type semiconductor layer on the front electrode 1; the processing chamber 420 for forming an I-type semiconductor layer on the P-type semiconductor layer; the processing chamber 430 for forming an N-type semiconductor layer on the I-type semiconductor layer; and the processing chamber 440 for forming the rear electrode 3 on the N-type semiconductor layer, wherein the respective processing chambers 400, 410, 420, 430, and 440 may be provided in the cluster-type arrangement surrounding the substrate-transferring chamber 100.

Figure 7:
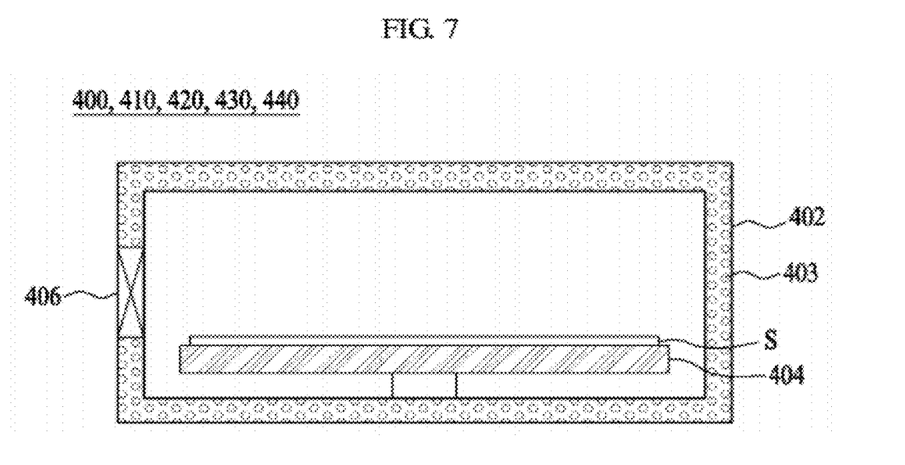
FIG. 7 illustrates a processing chamber according to the first embodiment of the present invention.

As shown in FIG. 7, each of the processing chambers 400, 410, 420, 430, and 440 according to the first embodiment of the present invention may comprise a chamber wall 402, and a susceptor 404.

The chamber wall 402 is arranged in communication with the substrate-transferring chamber 100, and the chamber wall 402 prepares a reaction space for the thin-film deposition process. Also, a door 406 is provided at one side of the chamber wall 402 so that the substrate can be easily loaded into or unloaded from each processing chamber through the door 406.

Also, a thermal-insulating member 408 provided in the chamber wall 402 enables the constant temperature inside the reaction space. Thus, the inner temperature of each of the processing chambers 400, 410, 420, 430, and 440 is constantly maintained to be lower than the temperature of the preheated substrate (S) by the thermal-insulating member 408 provided in the chamber wall 402.

The susceptor 404 is elevated by a driving apparatus (not shown), and the elevated susceptor 404 supports the preheated substrate (S) loaded through the door 406 by the substrate-transferring unit 110. At this time, the susceptor 404 may be provided with a heating apparatus which constantly maintains the temperature of the susceptor 404 to be identical to the inner temperature of the processing chamber. The heating apparatus may be a heating coil or heating pipe. In the meantime, since the preheated substrate (S) is placed onto the susceptor 404, the susceptor 404 may not include the additional heating apparatus for heating the substrate (S).

Figure 8:
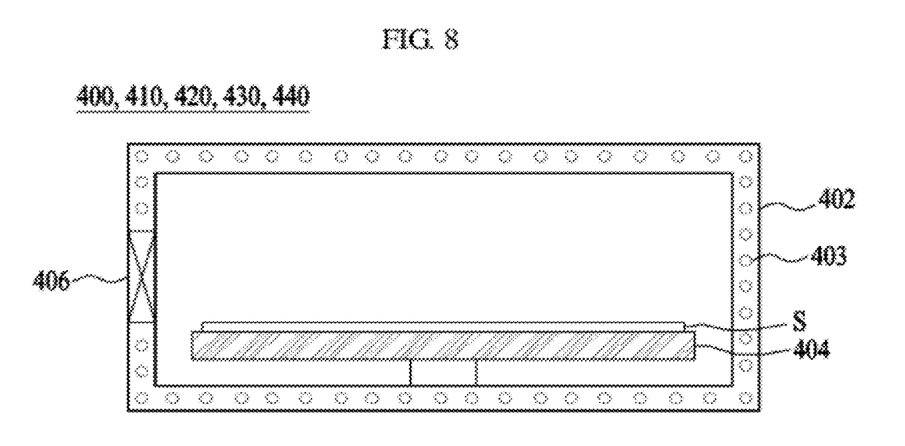
FIG. 8 illustrates a processing chamber according to the second embodiment of the present invention.

As shown in FIG. 8, each of the processing chambers 400, 410, 420, 430, and 440 according to the second embodiment of the present invention may comprise a chamber wall 402, a thermal-insulating member 403, and a susceptor 404.

The chamber wall 402 is arranged in communication with the substrate-transferring chamber 100, and the chamber wall 402 prepares a reaction space for the thin-film deposition process. Also, a door 406 is provided at one side of the chamber wall 402 so that the substrate can be easily loaded into or unloaded from each processing chamber through the door 406.

The thermal-insulating member 403 is provided in the chamber wall 402, so that the inner temperature of each of the processing chambers 400, 410, 420, 430, and 440 is constantly maintained within a range between the atmospheric temperature and the temperature of the preheated substrate (S). At this time, the thermal-insulating member 403 may be a heating coil or heating pipe.

The susceptor 404 is elevated by a driving apparatus (not shown), and the elevated susceptor 404 supports the preheated substrate (S) loaded through the door 406 by the substrate-transferring unit 110. At this time, the susceptor 404 may be provided with a heating apparatus which constantly maintains the temperature of the susceptor 404 to be identical to the inner temperature of the processing chamber. The heating apparatus may be a heating coil or heating pipe. In the meantime, since the preheated substrate (S) is placed onto the susceptor 404, the susceptor 404 may not include the additional heating apparatus for heating the substrate (S).

Figure 9:
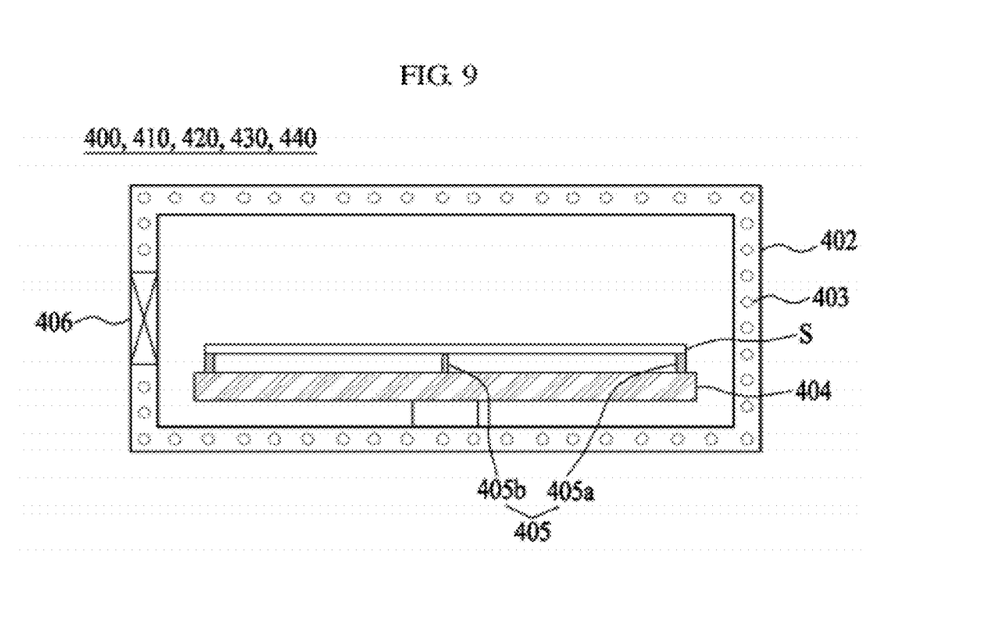
FIG. 9 illustrates a processing chamber according to the third embodiment of the present invention.

As shown in FIG. 9, each of the processing chambers 400, 410, 420, 430, and 440 according to the third embodiment of the present invention may comprise a chamber wall 402, a thermal-insulating member 403, a susceptor 404, and a substrate-supporting unit 405.

The chamber wall 402 is arranged in communication with the substrate-transferring chamber 100, and the chamber wall 402 prepares a reaction space for the thin-film deposition process. Also, a door 406 is provided at one side of the chamber wall 402 so that the substrate can be easily loaded into or unloaded from each processing chamber through the door 406.

The thermal-insulating member 403 is provided in the chamber wall 402, so that the inner temperature of each of the processing chambers 400, 410, 420, 430, and 440 is constantly maintained within a range between the atmospheric temperature and the temperature of the preheated substrate (S). At this time, the thermal-insulating member 403 may be a heating coil or heating pipe.

The susceptor 404 is elevated by a driving apparatus (not shown). At this time, the susceptor 404 may be provided with a heating apparatus which constantly maintains the temperature of the susceptor 404 to be identical to the inner temperature of the processing chamber. The heating apparatus may be a heating coil or heating pipe. In the meantime, since the preheated substrate (S) is placed onto the susceptor 404, the susceptor 404 may not include the additional heating apparatus for heating the substrate (S).

The substrate-supporting unit 405 with a predetermined height is provided on the susceptor 404; and the substrate-supporting unit 405 supports the preheated substrate (S) loaded through the door 406 by the substrate-transferring unit 110. According as the preheated substrate (S) is supported at the predetermined height from the susceptor 404 by the substrate-supporting unit 405, a gap corresponding to the predetermined height is generated between the susceptor 404 and the preheated substrate (S). Thus, the substrate-supporting unit 405 can minimize a heat transmission path from the preheated substrate (S) to the susceptor 404 so that a cooling speed of the preheated substrate (S) can be delayed at maximum, thereby resulting in high uniformity of the thin-film deposition process.

For this, the substrate-supporting unit 405 may comprise a first substrate-supporting member 405a for supporting the margin of the preheated substrate (S); and a second substrate-supporting member 405b for supporting the center of the preheated substrate (S).

The first substrate-supporting member 405a with a predetermined height is provided along the margin of the susceptor 404, to thereby support the margin of the preheated substrate (S). At this time, the first substrate-supporting member 405a may be formed of a material whose thermal conduction is lower than that of the susceptor 404. For example, the first substrate-supporting member 405a may be formed of heat-resistant plastic, heat-resistant polymer, quartz, or metal (for example, stainless, aluminum, ceramic, and etc.).

Figure 10:
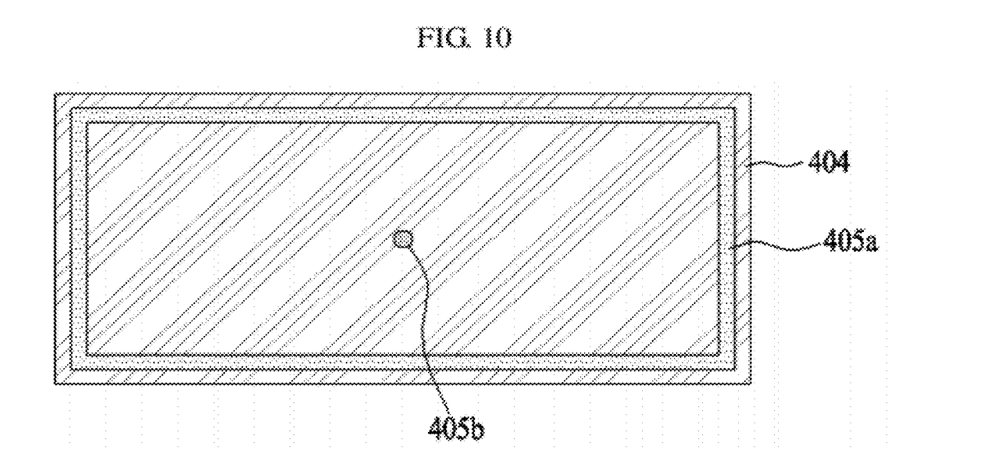
FIG. 10 illustrates a substrate-supporting unit according to the first embodiment of the present invention, the substrate-supporting unit included in the processing chamber of the present invention.

As shown in FIG. 10, the first substrate-supporting member 405a with a predetermined width and height, which is formed as one body, may be provided along the margin of the susceptor 404. Thus, the first substrate-supporting member 405a having the aforementioned structure prevents ingredient gases supplied to the inside of each of the processing chambers 400, 410, 420, 430, and 440 from penetrating through the gap between the preheated substrate (S) and the susceptor 404.

Figure 11:
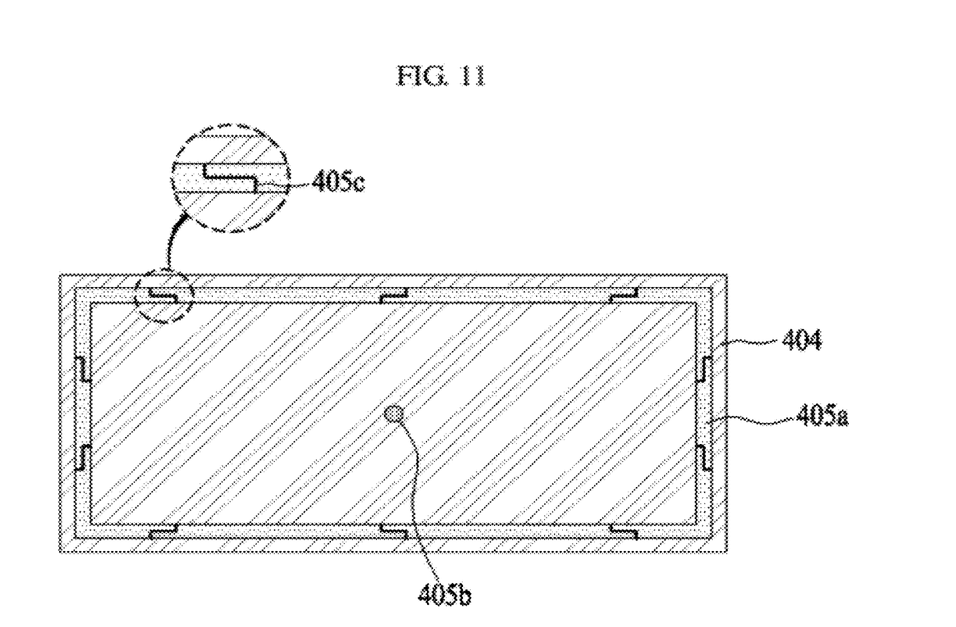
FIG. 11 illustrates a substrate-supporting unit according to the second embodiment of the present invention, the substrate-supporting unit included in the processing chamber of the present invention.

Furthermore, as shown in FIG. 11, the first substrate-supporting member 405a with a predetermined width and height may be divided into a plurality of sub-supporting members provided along the margin of the susceptor 404. In this case, each sub-supporting member has a cross section suitable for being engaged with the neighboring sub-supporting member (405c). That is, the sub-supporting members are engaged with one another, as shown in FIG. 11. This engagement structure enables an extension of penetration path of ingredient gases, supplied to the inside of each of the processing chambers 400, 410, 420, 430, and 440, through the gap between the preheated substrate (S) and the susceptor 404 so that it is possible to maximize the efficiency of preventing the penetration of the ingredient gases.

The second substrate-supporting member 405b with a predetermined height is provided at the center of the susceptor 404, to thereby support the center of the preheated substrate (S). In order to minimize a contact area between the preheated substrate (S) and the second substrate-supporting member 405b, the second substrate-supporting member 405b may have an uneven (or curved) upper surface. The second substrate-supporting member 405b is formed of the same material as that of the first substrate-supporting member 405a.

Figure 12:
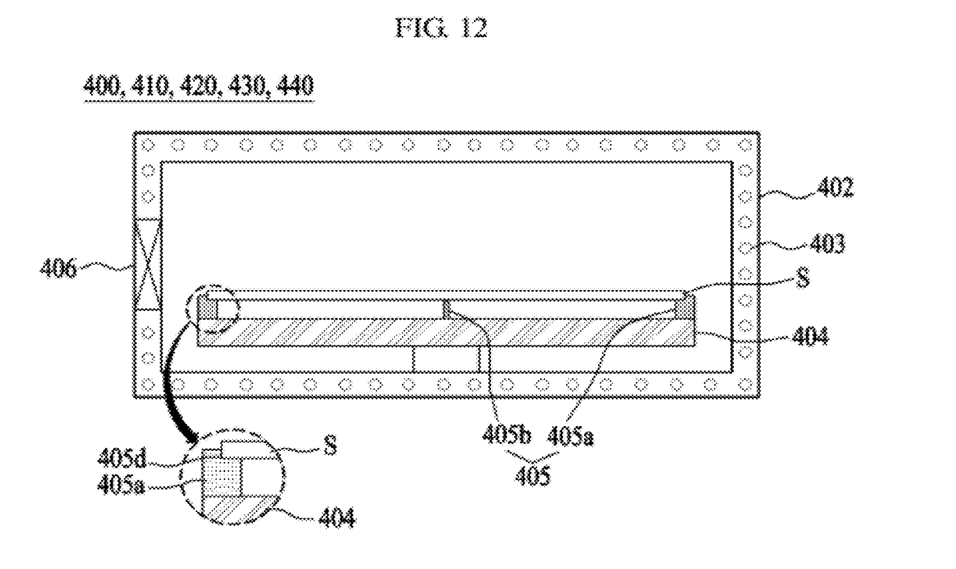
FIG. 12 illustrates a processing chamber according to the fourth embodiment of the present invention.

As shown in FIG. 12, each of the processing chambers 400, 410, 420, 430, and 440 according to the fourth embodiment of the present invention may comprise a chamber wall 402, a thermal-insulating member 403, a susceptor 404, and a substrate-supporting unit 405. Except a first substrate-supporting member 405a included in the substrate-supporting unit 405, each processing chamber 400, 410, 420, 430, 440 according to the fourth embodiment of the present invention is identical in structure to each processing chamber according to third embodiment of the present invention, whereby a detailed explanation for the same structure will be omitted.

Except that the first substrate-supporting member 405a is provided with a step-shaped portion 405d for supporting the rear and lateral surfaces of the preheated substrate (S), the first substrate-supporting member 405a is the same as that of the aforementioned embodiment. As explained above, the first substrate-supporting member 405a with a predetermined height is provided along the margin of the susceptor 404, to thereby support the margin of the preheated substrate (S).

The preheated substrate (S) placed in the first substrate-supporting member 405a is aligned automatically owing to the step-shaped portion 405d. Also, the step-shaped portion 405d provides an extended contact area between the preheated substrate (S) and the first substrate-supporting member 405a, which enables an extension of penetration path of ingredient gases through the gap between the preheated substrate (S) and the susceptor 404, so that it is possible to maximize the efficiency of preventing the penetration of the ingredient gases.

Figure 13:
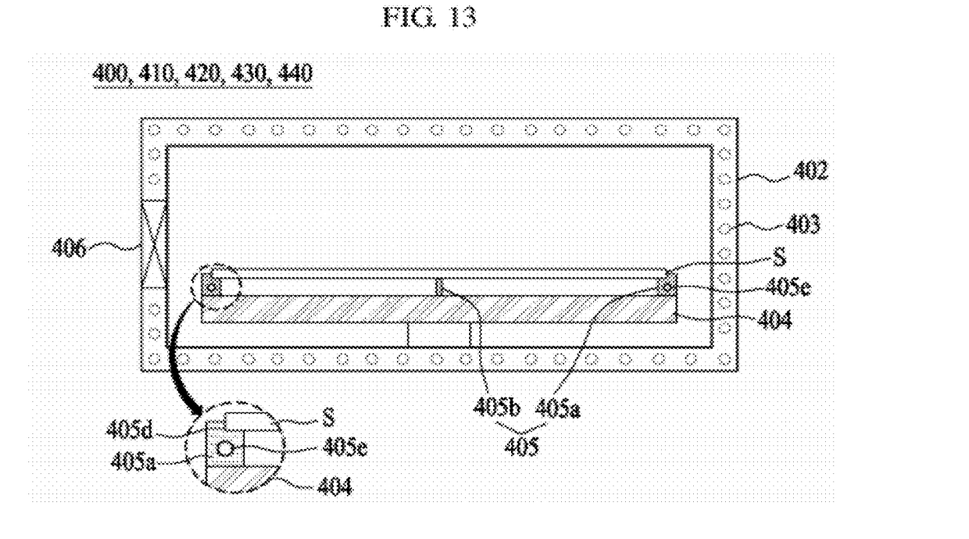
FIG. 13 illustrates a processing chamber according to the fifth embodiment of the present invention.

As shown in FIG. 13, the first substrate-supporting member 405a may additionally include a temperature-controlling member 405e.

The temperature-controlling member 405e is provided inside the first substrate-supporting member 405a so that the first substrate-supporting member 405a is maintained at the predetermined temperature which is higher than the temperature of the susceptor 404, whereby the cooling speed of the preheated substrate (S) can be delayed at maximum.

The respective processing chambers 400, 410, 420, 430, and 440 according to the first to fourth embodiments of the present invention can be provided in the cluster-type arrangement to surround the substrate-transferring chamber 100.

The apparatus for manufacturing the semiconductor device according to the first embodiment of the present invention may further include at least one surface treatment chamber (not shown) for treating the surface of thin film so as to improve the interfacial property of the thin film formed on the substrate by the thin-film deposition process in each of the processing chambers 400, 410, 420, 430, and 440. In this case, at leas one surface treatment chamber (not shown) may be selected from the plurality of processing chambers 400, 410, 420, 430, and 440; or may be provided additionally.

In this surface treatment chamber, the plasma or annealing process using argon (Ar) gas or hydrogen ($H_2$) gas is applied to treat the surface of thin film deposited on the substrate, to thereby lower the Rms value and improve the electron mobility in the thin film deposited on the substrate.

In the apparatus for manufacturing the semiconductor device according to the first embodiment of the present invention, the substrate (S) is firstly preheated to the predetermined temperature which is higher than the processing temperature of each of the processing chambers 400, 410, 420, 430, and 440 by the preheating chamber 300; and then the thin-film deposition process is applied to the preheated substrate (S) in the processing chamber 400, 410, 420, 430, and 440 whose temperature is constantly maintained to be lower than the temperature of the preheated substrate (S), so that it is possible to minimize contamination of the inside of each processing chamber, and further to extend a cleaning cycle for each processing chamber.

In case of the related art, the susceptor is heated to be higher than the processing temperature, whereby the inside of the processing chamber is maintained at the temperature which induces decomposition of the ingredient gas and deposition of the decomposed elements. As a result, the thin film can be deposited on undesired portions (for example, inside walls of the processing chamber, gas-spraying means, susceptor, and etc.) as well as the substrate corresponding to a targeted portion, whereby the processing chamber has to be cleaned more frequently. Meanwhile, in case of the present invention, the inner temperature of the processing chamber is constantly maintained to be lower than the aforementioned processing temperature of the related art, and only the substrate is preheated in the processing chamber 300, whereby the thin film is deposited only on the substrate since only the preheated substrate has the processing temperature in the processing chamber, to thereby minimize the deposition of thin film on the other portions except the substrate. Accordingly, the cleaning cycle for each processing chamber in the present invention can be more extended in comparison to that of the related art.

In the apparatus for manufacturing the semiconductor device according to the first embodiment of the present invention, the preheated substrate (S) is supported at the predetermined height from the susceptor 404 by the substrate-supporting unit 405, whereby the cooling speed of the preheated substrate (S) is delayed at maximum owing to the minimized contact area between the preheated substrate (S) and the susceptor 404, thereby resulting in the improved uniformity of thin-film deposition. The apparatus for manufacturing the semiconductor device according to the first embodiment of the present invention carries out the process for treating the surface of thin film after the thin-film deposition process, which enables to lower the Rms value and to improve the electron mobility in the thin film deposited on the substrate, thereby resulting in the improved interfacial property in the thin film deposited on the substrate.

Figure 14:
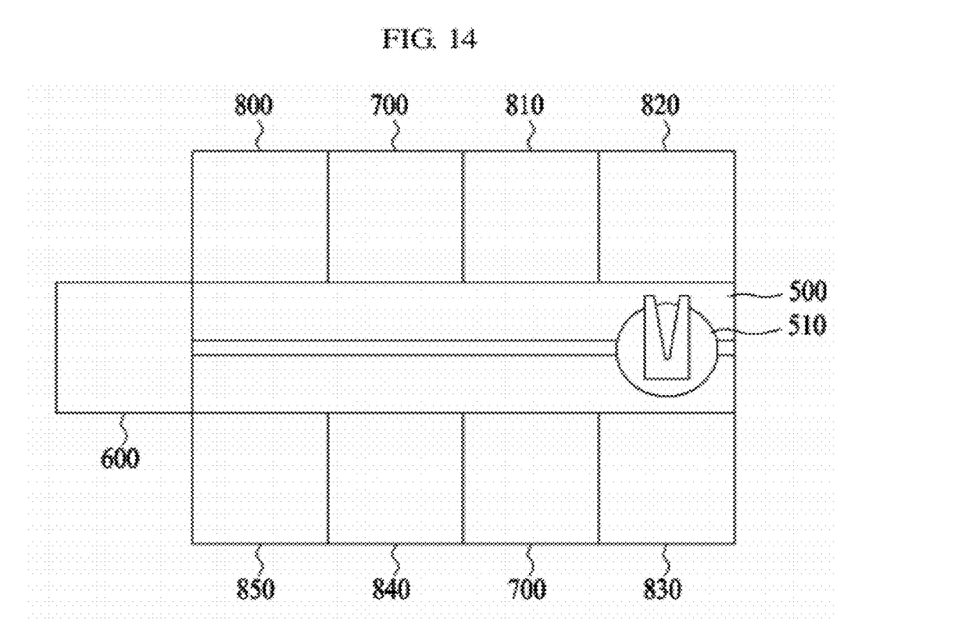
FIG. 14 illustrates an apparatus for manufacturing a semiconductor device according to the second embodiment of the present invention.

FIG. 14 illustrates an apparatus for manufacturing a semiconductor device according to the second embodiment of the present invention.

Referring to FIG. 14, the apparatus for manufacturing the semiconductor device according to the second embodiment of the present invention has an in-line arrangement structure; which includes a substrate-transferring line 500, a load-lock chamber 600, at least one preheating chamber 700, and a plurality of processing chambers 800, 810, 820, 830, 840, and 850.

The substrate-transferring line 500 for transferring a substrate is provided among the at least one preheating chamber 700 and the plurality of processing chambers 800, 810, 820, 830, 840, and 850. For this, the substrate-transferring line 500 includes a substrate-transferring unit 510 for transferring the substrate to the respective chambers 600, 700, 800, 810, 820, 830, 840, and 850.

The substrate-transferring unit 510 is movably provided in the substrate-transferring line 500, wherein the substrate-transferring unit 510 may transfer the substrate stored in the load-lock chamber 600 to the respective chambers 700, 800, 810, 820, 830, 840, and 850; or may transfer the substrate among the respective chambers 700, 800, 810, 820, 830, 840, and 850.

The load-lock chamber 600 includes at least one substrate-storing slot (not shown) for temporarily storing the substrate supplied from the external therein; a substrate-supporting unit (not shown) for preventing the substrate from being in direct contact with each substrate-storing slot; and a door (not shown) through which the substrate is easily loaded or unloaded.

The at least one preheating chamber 700 preheats the substrate transferred by the substrate-transferring unit 510 to a predetermined temperature which is higher than a temperature of a thin-film deposition process. In this case, the preheating temperature of the substrate is determined in consideration to the cooling margin on transferring the substrate from the preheating chamber 700 to the respective processing chambers 800, 810, 820, 830, 840, and 850, and processing time and temperature in the processing chambers 800, 810, 820, 830, 840, and 850. For example, if the processing temperature is at 100~400° C., the preheating temperature of the substrate may be 20% higher than the processing temperature. The preheating chamber 700 may preheat the substrate to the predetermined temperature through the use of heating apparatus such as a coil heater or lamp heater.

The plurality of processing chambers 800, 810, 820, 830, 840, and 850 are arranged along two rows facing each other with the substrate-transferring line 500 interposed therebetween. The substrate preheated in the preheating chamber 700 is transferred to and received in the respective chambers 800, 810, 820, 830, 840, and 850 by the substrate-transferring unit 510; and then the thin-film deposition process using the CVD method is applied to the preheated substrate. According as the preheated substrate is slowly cooled in each of the respective chambers 800, 810, 820, 830, 840, and 850, the thin-film deposition process proceeds. Since the preheated substrate is slowly cooled to 100~400° C., by the constantly-maintained inner temperature of the processing chamber, the desired thin film can be deposited on the substrate without applying the additional heating process to the substrate through the use of additional heating apparatus. In this case, the aforementioned thin-film deposition process may indicate the process for depositing ZnO thin film on the preheated substrate, but it is not limited to this. For example, the aforementioned thin-film deposition process may be any process for forming the desired thin film on the substrate in methods for manufacturing the semiconductor device, solar cell, liquid crystal display device, light-emitting display device, and etc.

Each of the processing chambers 800, 810, 820, 830, 840, and 850 may be identical in structure to any one of those shown in FIGS. 4 to 12, whereby a detailed explanation for the structure of each processing chamber will be omitted.

In each of the aforementioned processing chambers 800, 810, 820, 830, 840, and 850, the thin-film deposition process is firstly applied to the preheated substrate (S), and the plasma or annealing process using argon (Ar) gas or hydrogen ($H_2$) gas is applied thereto so as to treat the surface of the thin film deposited on the substrate, to thereby lower the Rms value and to improve the electron mobility in the thin film deposited on the substrate.

At least one preheating chamber 700 may be arranged in each row according to the processing time of each processing chamber 800, 810, 820, 830, 840, and 850.

As shown in FIG. 6, if manufacturing the solar cell comprising a front electrode 1, a semiconductor layer 2, and a rear electrode 3 on the preheated substrate (S), the apparatus for manufacturing the semiconductor device according to the present invention may comprise the processing chamber 800 for forming the front electrode 1 of a transparent material such as ZnO on the preheated substrate (S); the processing chamber 810 for forming a P-type semiconductor layer on the front electrode 1; the processing chamber 820 for forming an I-type semiconductor layer on the P-type semiconductor layer; the processing chamber 830 for forming an N-type semiconductor layer on the I-type semiconductor layer; and the processing chamber 840 for forming the rear electrode 3 on the N-type semiconductor layer, wherein the respective processing chambers 800, 810, 820, 830, 840, and 850 may be provided in the in-line arrangement to be adjacent to the substrate-transferring chamber 500.

The apparatus for manufacturing the semiconductor device according to the second embodiment of the present invention may further include at least one surface treatment chamber (not shown) for treating the surface of the thin film deposited on the substrate after completing the thin-film deposition process in each of the processing chambers 800, 810, 820, 830, 840, and 850. In this case, at least one surface treatment chamber (not shown) may be selected from the plurality of processing chambers 800, 810, 820, 830, 840, and 850; or may be provided additionally.

In this surface treatment chamber (not shown), the plasma or annealing process using argon (Ar) gas or hydrogen ($H_2$) gas is applied to treat the surface of the thin film deposited on the substrate, whereby the Rms value is lowered and electron mobility is improved in the thin film deposited on the substrate.

In the apparatus for manufacturing the semiconductor device according to the second embodiment of the present invention, the substrate (S) is firstly preheated to the predetermined temperature which is higher than the processing temperature of each of the processing chambers 800, 810, 820, 830, 840, and 850 by the preheating chamber 700; and then the thin-film deposition process is applied to the preheated substrate (S) in the processing chamber 800, 810, 820, 830, 840, and 850 whose temperature is constantly maintained to be lower than the temperature of the preheated substrate (S), so that it is possible to minimize contamination of the inside of each processing chamber, and further to extend a cleaning cycle for each processing chamber.

In the apparatus for manufacturing the semiconductor device according to the second embodiment of the present invention, the preheated substrate (S) is supported at the predetermined height from the susceptor 404 by the substrate-supporting unit 405, whereby the cooling speed of the preheated substrate (S) is delayed at maximum owing to the minimized contact area between the preheated substrate (S) and the susceptor 404, thereby resulting in the improved uniformity of thin-film deposition. The apparatus for manufacturing the semiconductor device according to the second embodiment of the present invention carries out the process for treating the surface of thin film after the thin-film deposition process, which enables to lower the Rms value and to improve the electron mobility in the thin film deposited on the substrate, thereby resulting in the improved interfacial property in the thin film deposited on the substrate.

Accordingly, the method and apparatus for manufacturing the semiconductor device according to the present invention has the following advantages.

The substrate is firstly preheated to the predetermined temperature which is higher than the processing temperature of each of the processing chambers; and then the thin-film deposition process is applied to the preheated substrate in the processing chamber whose temperature is constantly maintained to be lower than the temperature of the preheated substrate, so that it is possible to minimize the contamination of the inside of each processing chamber, and further to extend the cleaning cycle for each processing chamber.

Furthermore, the yield can be improved owing to the extension of the lifespan of the processing chamber.

Also, the preheated substrate (S) is supported by the substrate-supporting unit while being maintained at the predetermined height from the susceptor, whereby the cooling speed of the preheated substrate (S) is delayed at maximum owing to the minimized contact area between the preheated substrate (S) and the susceptor, thereby resulting in the improved uniformity of thin-film deposition. At this time, if the temperature of the susceptor is lower than the processing temperature, the cooling speed of the preheated substrate can be delayed more.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing a semiconductor device comprising:
    preheating a substrate;
    placing the preheated substrate onto a substrate-supporting unit provided in a susceptor while the preheated substrate is maintained at a predetermined height from an upper surface of the susceptor provided in a processing chamber; and
    forming a thin film on the preheated substrate maintained at a predetermined height from an upper surface of the susceptor by the substrate-supporting unit,
    wherein a temperature of the preheated substrate is higher than a processing temperature for forming the thin film in the processing chamber.

2. The method of claim 1, wherein the temperature of the preheated substrate is 20% higher than the processing temperature.

3. The method of claim 1, wherein the inside of the processing chamber is maintained at a predetermined temperature which is lower than the temperature of the preheated substrate.

4. The method of claim 1, wherein the inside of the processing chamber is maintained at a predetermined temperature which is lower than the temperature of the preheated substrate by the thermal-insulating member provided in an inner wall of the processing chamber.

5. The method of claim 1, further comprising:
    heating the substrate-supporting unit,
    wherein the substrate-supporting unit is maintained at a predetermined temperature which is higher than the temperature of the susceptor.

6. The method of claim 1, further comprising:
    treating a surface of the thin film formed on the substrate by a plasma or annealing process using argon (Ar) or hydrogen ($H_2$) gas in a surface-treatment chamber so as to improve an interfacial property of the thin film formed on the substrate, when completing the process for forming the thin film in the processing chamber,
    wherein the thin film is formed of zinc oxide (ZnO).

7. The method of claim 1, wherein the process for forming the thin film on the preheated substrate is carried out by PECVD or MOCVD.

8. A method for manufacturing a semiconductor device comprising:
    preheating a substrate;
    placing the preheated substrate onto a substrate-supporting unit provided in a susceptor while the preheated substrate is maintained at a predetermined height from an upper surface of the susceptor provided in a processing chamber; and
    forming a thin film on the preheated substrate maintained at a predetermined height from an upper surface of the susceptor by the substrate-supporting unit,
    wherein the inside of the processing chamber is maintained at a predetermined temperature which is lower than a temperature of the preheated substrate.

9. The method of claim 8, wherein the inside of the processing chamber is maintained at 120° C. or less.

10. The method of claim 8, wherein the inside of the processing chamber is maintained at a predetermined temperature which is lower than the temperature of the preheated substrate by the thermal-insulating member provided in an inner wall of the processing chamber.

11. The method of claim 8, further comprising:
    treating a surface of the thin film formed on the substrate by a plasma or annealing process using argon (Ar) or hydrogen ($H_2$) gas in a surface-treatment chamber so as to improve an interfacial property of the thin film formed on the substrate, when completing the process for forming the thin film in the processing chamber, wherein the thin film is formed of zinc oxide (ZnO).

12. The method of claim 8, further comprising:
heating the substrate-supporting unit,
wherein the substrate-supporting unit is maintained at a predetermined temperature which is higher than the temperature of the susceptor.

13. A method for manufacturing a semiconductor device comprising:
preheating a substrate;
placing the preheated substrate onto a substrate-supporting unit of a susceptor provided in a processing chamber; and
forming a thin film on the preheated substrate raised at a predetermined height from an upper surface of the susceptor by the substrate-supporting unit,
wherein the substrate-supporting unit delays a cooling speed of the preheated substrate.

14. The method of claim 13, wherein a temperature of the preheated substrate is higher than a processing temperature for forming the thin film in the processing chamber.

15. The method of claim 13, wherein the inside of the processing chamber is maintained at a predetermined temperature which is lower than a temperature of the preheated substrate.

16. The method of claim 13, wherein the preheated substrate is supported at the predetermined height from an upper surface of the susceptor by the substrate-supporting unit.

17. The method of claim 13, wherein the cooling speed of the preheated substrate is delayed by a gap of the predetermined height generated between the susceptor and the preheated substrate.

18. The method of claim 13, further comprising:
heating the substrate-supporting unit,
wherein the substrate-supporting unit is maintained at a predetermined temperature which is higher than the temperature of the susceptor.

19. The method of claim 13, wherein the process for forming the thin film on the preheated substrate is carried out by PECVD or MOCVD.

20. The method of claim 13, wherein the susceptor is not heated.

* * * * *